United States Patent [19]

Kueneman

[11] Patent Number: 4,991,665

[45] Date of Patent: Feb. 12, 1991

[54] FLEXIBLE CIRCUIT CONDUCTOR RUN

[75] Inventor: Joseph A. Kueneman, Torrance, Calif.

[73] Assignee: Buss Systems Incorporated, El Segundo, Calif.

[21] Appl. No.: 279,790

[22] Filed: Dec. 5, 1988

[51] Int. Cl.⁵ ............................................. H01B 11/00
[52] U.S. Cl. ............................... 174/34; 174/117 FF; 333/238
[58] Field of Search ............... 174/34, 117 FF; 333/1, 333/238

[56] References Cited

U.S. PATENT DOCUMENTS

| | | | |
|---|---|---|---|
| 3,662,294 | 5/1972 | Jacobs et al. | 333/238 X |
| 3,761,842 | 9/1973 | Gandrud | 333/1 |
| 3,764,727 | 10/1973 | Balde | 333/238 X |
| 3,997,714 | 12/1976 | Letellier et al. | 174/34 |
| 4,130,723 | 12/1978 | Wakeling | 333/238 X |

Primary Examiner—Morris H. Nimmo
Attorney, Agent, or Firm—Drucker & Sommers

[57] ABSTRACT

A flexible circuit conductor run for connecting circuit elements comprises a thin sheet which includes a plurality of pairs of generally parallel spaced-apart thin conductors.

Each conductor in each pair of conductors includes alternating lengths of crossing portions and extending portions. Each length of conductor extending portions includes generally sidewardly-projecting tine portions.

Such flexible circuit conductor run enables the characteristic impedance thereof at high power and operating frequencies to be substantially matched with the characteristic impedance of the circuit elements at such power and operating frequencies, to enable effective signal transfer and reduced signal loss between the circuit elements through the flexible circuit conductor run.

14 Claims, 2 Drawing Sheets

FLEXIBLE CIRCUIT CONDUCTOR RUN

BACKGROUND OF THE INVENTION

The invention relates generally to conductors for interconnecting components. It relates specifically to a flexible circuit conductor run.

It has been known to use a flexible circuit conductor run for connecting circuit elements, so as to transfer signals therethrough, in devices such as communications devices, computers, or the like. The conductors in such conductor runs consist of a plurality of pairs of generally parallel spaced-apart thin conductors, as in Baldyga U.S. Pat. No. 4,129,939, Walton U.S. Pat. No. 4,092,057, Luetzow U.S. Pat. No. 3,818,122, and Reyner II et al U.S. Pat. No. 3,818,117.

Impedance is the square root of the ratio of inductance to capacitance. Every conductor has impedance resulting from magnetic fields generated by current flow therethrough.

Impedance matching is particularly important for conductors at higher power and frequencies, used presently for faster operation, greater signal resolution, and improved precision in components.

However, as signal power and frequencies increase, impedance mismatch becomes a greater problem, because energy is absorbed in creating and releasing radiating magnetic fields, conductor runs assume dynamic properties and interact with systems producing unwanted effects, and fields from adjacent conductors interact to transfer signals from one to the other producing undesirable crosstalk effects.

Further, as component sizes decrease to provide greater functionality in each component, each increase in functional density results in a corresponding reduction in power consumption and power delivery, which in turn necessitates higher quality circuit interconnections.

In order to transfer signals effectively between circuit elements through a flexible circuit conductor run, the characteristic impedance of the circuit elements and the conductor run, at high operating power and frequencies, should be substantially matched, i.e. they should be substantially within operating tolerances. Impedance mismatch results in reduced energy transfer and increased signal distortion.

It has been further known to provide electrically conductive flat cable strips with the paths of each pair of conductors crossing one another at periodic strip locations, to significantly reduce crosstalk between wires in the cable, as in Balde U.S. Pat. No. 3,764,727. It has been still further known to provide twisted pairs of flat conductor cable with different pseudo-twisted pairs of conductors, adapted to control capacitance by decreasing the area of crossover region, as in Ganrud U.S. Pat. No. 3,761,842. However, the problems regarding matching characteristic impedances of the circuit elements and flexible circuit conductor run at high operating power and frequencies are not addressed in such devices.

SUMMARY OF THE INVENTION

The flexible circuit conductor run of the invention is adapted to overcome the above problems, as well as others, associated with prior flexible circuit conductor runs.

It comprises a sheet of flexible circuitry that produces a high characteristic impedance, and is thin enough to maintain flexible qualities.

Such flexible circuit conductor run includes a plurality of pairs of generally parallel spaced-apart thin conductors, with each pair of conductors including alternating lengths of crossing portions an extending portions.

Each length of extending portions of each conductor in each pair of conductors includes a generally sidewardly projecting tine (i.e. branch) portion. Each tine portion extends generally perpendicular to each extending portion, and congruent to the tine portion and to the parallel part of the extending portion of the other conductor of the pair of conductors.

Such flexible circuit conductor run enables the characteristic impedance thereof, at high operating power and frequencies, to be substantially matched with the characteristic impedances of the circuit elements at such high operating power and frequencies, for effective signal transfer and reduced signal loss.

DESCRIPTION OF THE PREFERRED EMBODIMENT

Figure 1:
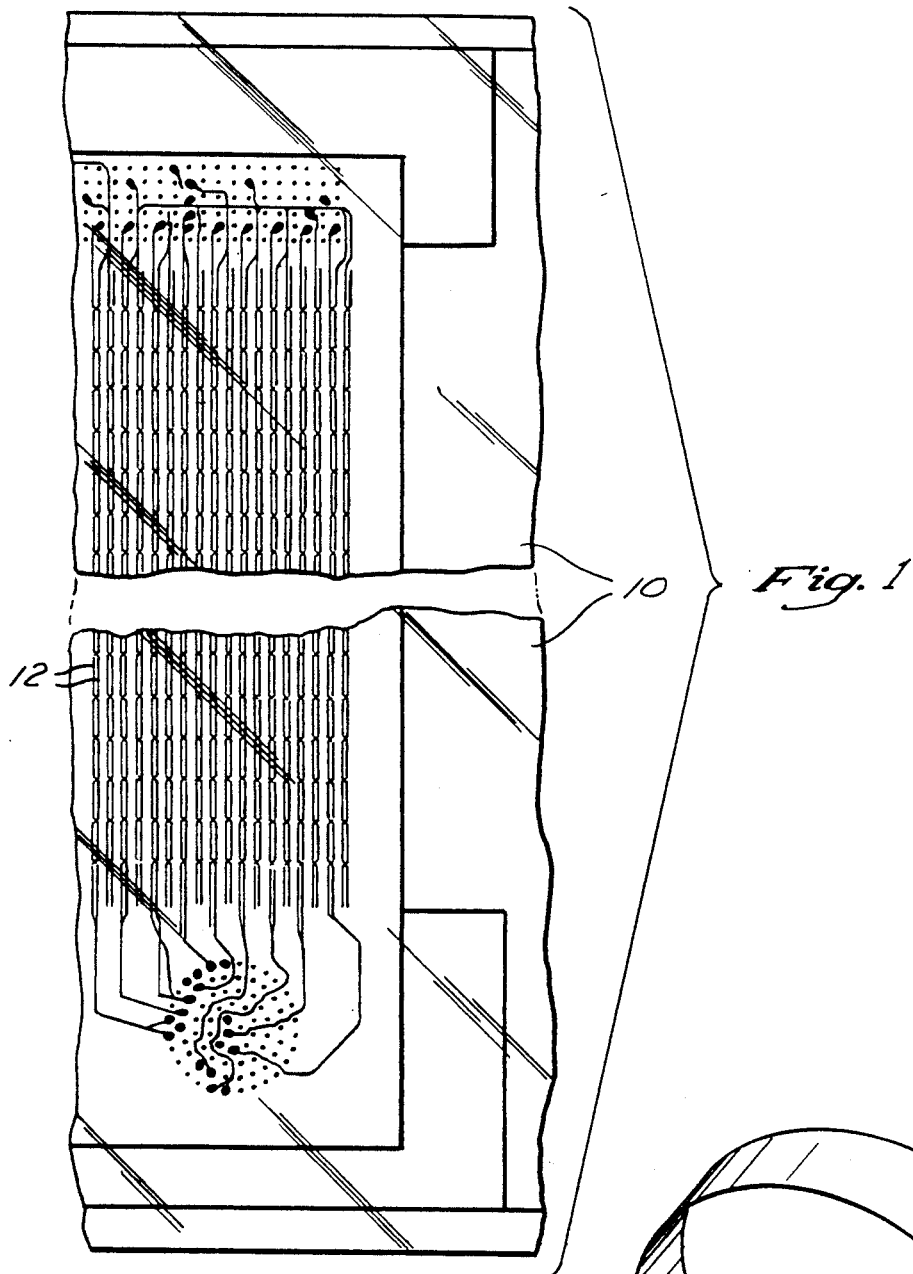
FIG. 1 is a plan view of a flexible circuit conductor run, pursuant to the invention.

The article of the invention, as shown in FIGS. 1-4 and as described herein, comprises, for example, a conductor run 10 comprised of a plurality of flexible circuits, for interconnecting circuit elements A and B.

Conductor run 10 comprises a thin sheet which includes a plurality of pairs of generally parallel spaced-apart thin conductors, as 12, 12. Each conductor 12, 12 may be comprised, for example, of copper, and includes alternating lengths of crossing portions, as 14, 14, and extending portions, as 16, 16.

Each length of conductor extending portions 16, 16, includes, for example, a generally sidewardly-projecting tine portions, as 18, 18. Such tine portions 18, 18 preferably extend generally perpendicular to extending portions 16, 16, and generally congruent to the generally parallel parts 20, 20 of extending portions 16, 16 of the other conductor of the pair of conductors 12, 12.

Conductor run 10 further includes layers of insulating material, for insulating conductors 12, 12 from each other and from other pairs of conductors. The layers of insulating material include opposed outer insulating layers 22, 22, and medial insulating layer 24. Each outer insulating layer 22, 22 and medial insulating layer 24 may be comprised, for example, of polyimide. Each conductor 12, 12 extends intermediate one of the opposed outer insulating layers 22, 22 and the medial insulating layer 24.

Conductor run 10 still further includes layers of adhesive material for securing the conductors and the layers of insulating material together. The layers of adhesive material include first and second adhesive layers 26, 26, each of which may be comprised of acrylic, epoxy, or other suitable agents.

Each of the first and second adhesive layers 26, 26 secures one of the conductors 12, 12 intermediate one of the outer insulating layers 22, 22 and the medial insulating layer 24. Further, each of the first and second adhesive layers 26, 26 comprises, for example, a pair of layers, as 28, 28, 30, 30, extending about each conductor 12, 12.

Figure 2:
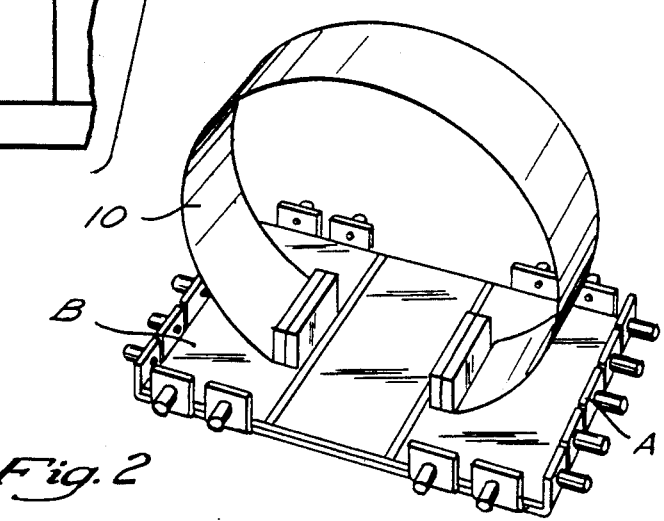
FIG. 2 is a perspective view of the flexible circuit conductor run interconnecting a driver and a receiver.
Figure 3:
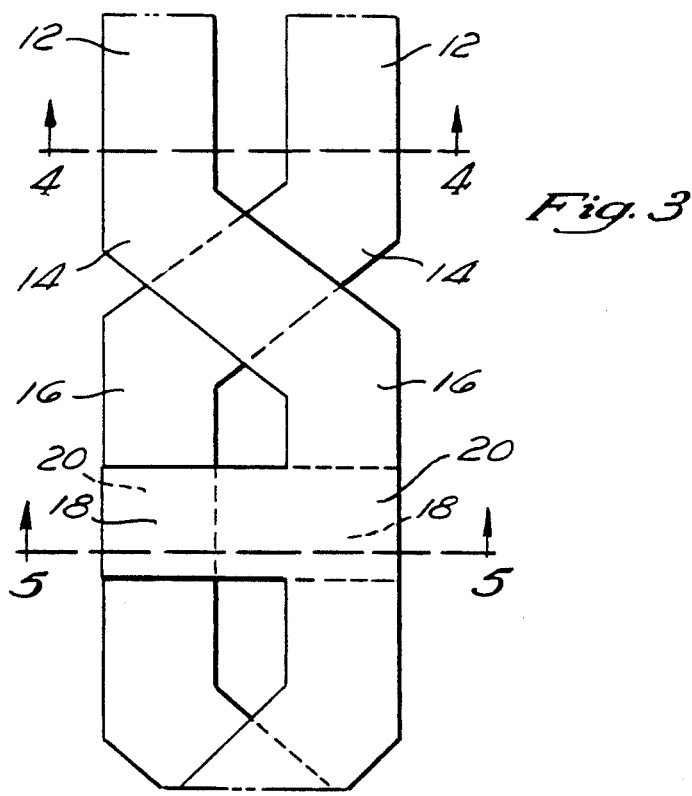
FIG. 3 is a plan view of a pair of parallel spaced-apart conductors in a portion of the flexible circuit conductor run.
Figure 4:
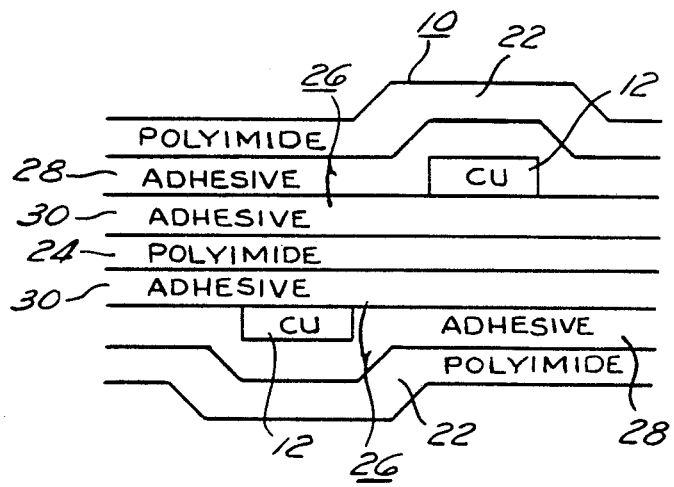
FIG. 4 is an elevational cross-sectional view of a portion of the flexible circuit conductor run, taken on line 4—4 of FIG. 3.
Figure 5:
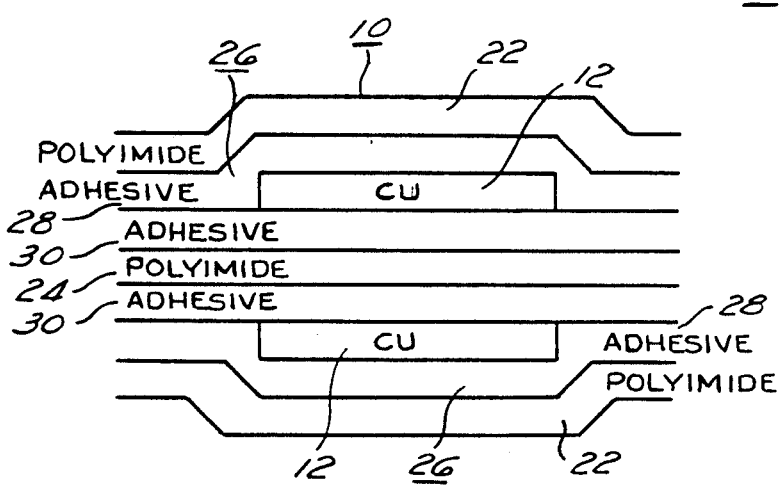

Conductor run 10 is adapted to be connected at the opposed ends thereof to circuit elements A and B, so as to form a thin flexible circuit loop interconnector, as shown in FIG. 2.

Circuit elements A and B, for example, are operable at high frequencies and low signal strengths. At such operating levels, the characteristic impedance generated in circuit elements A and B, for example, may be 150 ohms. The characteristic impedance generated in conductor run 10, at such operating frequencies, conducting current through crossing portions 14, 14, extending portions 16, 16, and congruent tine portions 18, 18 of each of the conductors 12, 12 in each of the plurality of generally parallel spaced-apart pairs of such conductors, may be, for example, 130–132 ohms, substantially matched, within operating tolerances with such 150 ohm impedances of circuit elements A and B.

Such substantially matched impedance of conductor run 10 with the impedances of circuit elements A and B enables effective signal transfer and reduced signal loss.

A preferred embodiment of the invention has been set forth above, for the purpose of explaining the invention. However, it is to be understood that variations which may be made in such embodiment, which may nevertheless be within the scope and spirit of the invention as set forth in the claims herein.

I claim:

1. A conductor run, comprised of a thin flexible sheet which includes circuits, for interconnecting circuit elements, operable at a frequency at which characteristic impedances of the circuit elements and interconnecting flexible circuit conductor run are generated, which flexible circuit conductor run is adapted to generate a characteristic impedance at the operating frequency which is substantially matched with the characteristic impedances of the circuit elements at the operating frequency, comprising:
   (a) a plurality of pairs of generally parallel spaced-apart thin conductors, including means for controlling the characteristic impedance generated therein at the operating frequency, comprising alternating lengths of conductor crossing portions and conductor extending portions in each pair of conductors, in which each extending portion in each conductor in each pair of conductors includes a generally sidewardly-projecting tine portion, adapted to generate a characteristic impedance of the flexible circuit conductor run at the operating frequency substantially matched with the characteristic impedances of the circuit elements at the operating frequency;
   (b) means for insulating each pair of conductors and each conductor in each pair of conductors from each other; and
   (c) means for securing each of the pairs of conductors and each conductor in each of the pair of conductors in the insulating means in generally parallel spaced-apart relation to each other.

2. A conductor run as in claim 1, in which the tine portions of each pair of conductors extend from the extending sections of each conductor generally congruent relative to each other.

3. A conductor run as in claim 1, in which the extending portion of each of the pair of conductors includes a part generally parallel to the extending portion of the other conductor of the pair of conductors, and the tine portions of each pair of conductors extend from the extending sections of each conductor generally congruent to the tine portion and the generally parallel part of the extending portion of the other conductor of the pair of conductors.

4. A conductor run as in claim 1, in which the tine portions of each pair of conductors extend from the extending portions of each conductor generally perpendicular thereto.

5. A conductor run as in claim 1, in which the insulating means comprise a pair of opposed outer insulating layers, and a medial insulating layer, the securing means include a pair of layers, extending intermediate each of the pair of opposed outer insulating layers and the medial insulating layer, and in which one of the pair of conductors is secured by one of the pair of securing layers intermediate one of the pair of outer insulating layers and the medial insulating layer, and the other of the pair of conductors is secured by the other of the second pair of securing layers intermediate the other of the pair of outer insulating layers and the medial insulating layer.

6. A conductor run as in claim 1, in which the conductors are comprised of copper.

7. A conductor run as in claim 1, in which the insulating means are comprised of polyimide.

8. A conductor run as in claim 1, in which the securing means are comprised of an acrylic.

9. A conductor run as in claim 1, in which the means for securing each of the pairs of conductors are comprised of pairs of layers, with each pair of layers extending about each of the conductors.

10. A conductor run as in claim 2, in which the extending portion of each of the pair of conductors includes a part generally parallel to the extending portion of the other conductor of the pair of conductors, and the tine portions of each pair of conductors extend from the extending sections of each conductor generally congruent to the tine portion and the generally parallel part of the extending portion of the other conductor of the pair of conductors.

11. A conductor run as in claim 2, in which the tine portions of each pair of conductors extend from the extending portions of each conductor generally perpendicular thereto.

12. A conductor run as in claim 2, in which the conductors are comprised of copper.

13. A conductor run as in claim 2, in which the insulating means are comprised of polyimide.

14. A conductor run as in claim 2, in which the securing means are comprised of an acrylic.

* * * * *